United States Patent
Schemies

(10) Patent No.: US 7,061,346 B2
(45) Date of Patent: Jun. 13, 2006

(54) TRANSVERSAL FILTER COMPRISING AN IMPROVED NOTCH CHARACTERISTIC CURVE

(75) Inventor: Michael Schemies, Grasbrunn (DE)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 10/476,367

(22) PCT Filed: Apr. 10, 2002

(86) PCT No.: PCT/DE02/01322

§ 371 (c)(1),
(2), (4) Date: Apr. 12, 2004

(87) PCT Pub. No.: WO02/089324

PCT Pub. Date: Nov. 7, 2002

(65) Prior Publication Data

US 2004/0164820 A1    Aug. 26, 2004

(30) Foreign Application Priority Data

Apr. 30, 2001 (DE) ............................... 101 21 251

(51) Int. Cl.
*H03H 9/64*    (2006.01)
(52) U.S. Cl. .................... 333/196; 310/313 C
(58) Field of Classification Search ............. 333/196; 310/313 C
See application file for complete search history.

(56) References Cited

U.S. PATENT DOCUMENTS

| 4,075,582 A | 2/1978 | Walker ........................ 333/196 |
| 4,472,653 A | 9/1984 | Yamada .................. 310/313 C |
| 4,910,483 A | 3/1990 | Mitchell et al. ............. 333/196 |

FOREIGN PATENT DOCUMENTS

| JP | 53-114644 | * 10/1978 | .................. 333/194 |
| JP | 1-303911 | * 12/1989 | .................. 333/193 |
| RU | 2000655 C | 9/1993 | |

OTHER PUBLICATIONS

Basuk et al, "Design of Low-Shape-Factor SAW Filters Having a Single Acoustic Track", *1996 IEEE International Frequency Control Symposium*, pp. 291-295, Jun. 1996.

* cited by examiner

Primary Examiner—Barbara Summons
(74) Attorney, Agent, or Firm—Schiff Hardin LLP

(57) ABSTRACT

The invention provides a surface wave transversal filter having an input transducer and an output transducer in which the input transducer has a primary weighting which determines the transfer function and in which the output transducer is provided with a low secondary weighting in order to improve the trap characteristic.

6 Claims, 4 Drawing Sheets

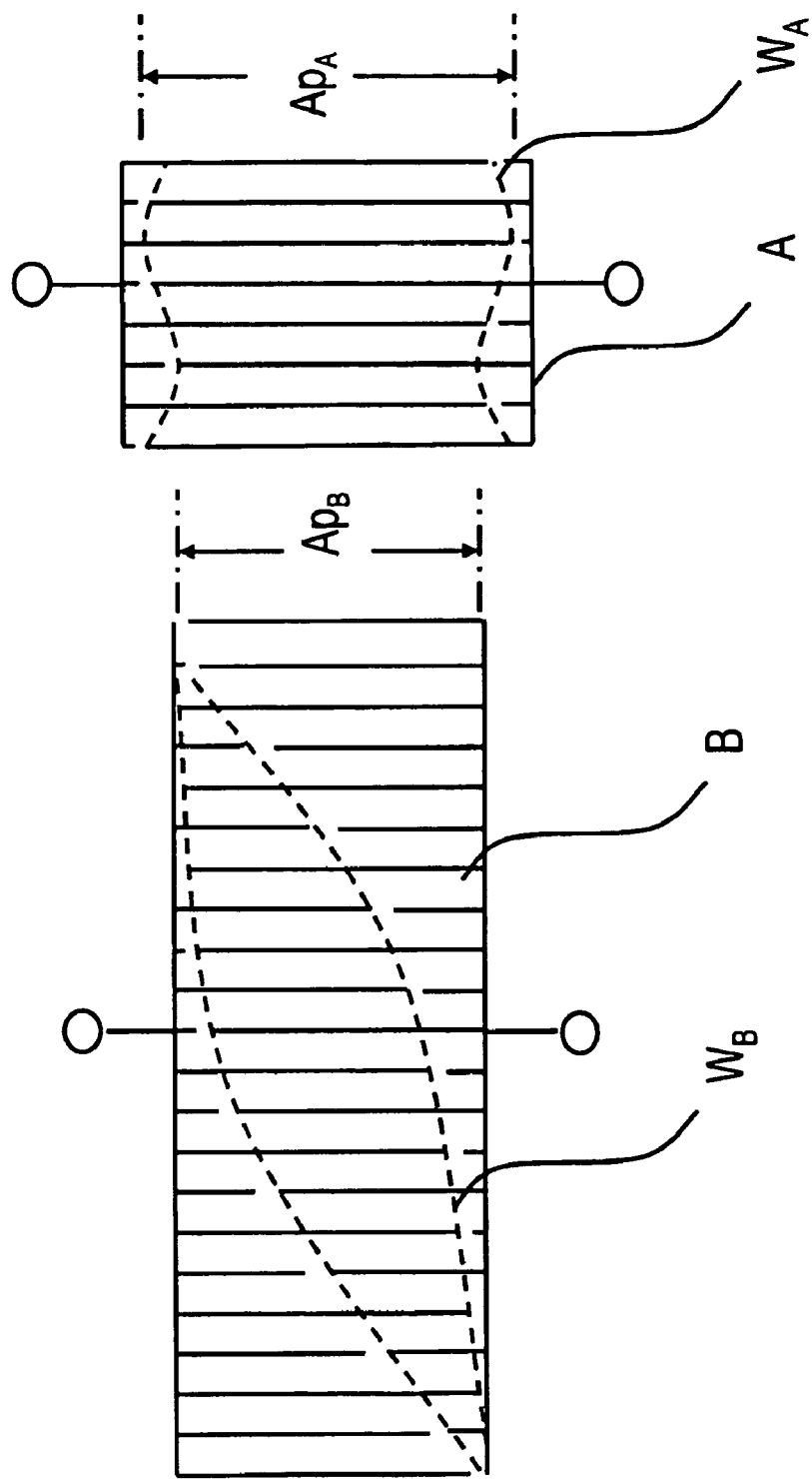

TRANSVERSAL FILTER COMPRISING AN IMPROVED NOTCH CHARACTERISTIC CURVE

BACKGROUND OF THE INVENTION

The subject matter of the invention is a surface wave transversal filter as used, in particular, as an intermediate frequency filter or precise-frequency transmission filter in consumer electronics.

Surface wave transversal filters ("SAW transversal filters" or "transversal filters"), are known, by way of example, from "SAW Components, Data Book 1996" from Siemens Matsushita Components and specifically in the section "General technical information" on pages 27 ff. These transversal filters are constructed on a crystalline piezoelectrical substrate and have two interdigital transducers which are used as input and output transducers.

The input transducer, to which the signal to be filtered is applied, has a weighting which is used to shape the transfer function. In contrast, the output transducer is short relative to the input transducer and is unweighted, and thus has the same overlap lengths for all the electrode fingers on the interdigital transducer. Such an unweighted interdigital transducer has a transfer function $$\frac{\sin(x)}{x}.$$

The exact form of the weighting of the input transducer is the result of optimization performed using inherently known suitable software tools. If the result of such optimization, i.e., a filter optimized by software, has a characteristic measured in real terms which does not match the desired characteristic, then various methods for measurement correction are known. Essentially, this is achieved by varying the overlap length of the electrode fingers in the input transducer. In a number of cases, however, such measurement correction does not result in the desired success following software optimization. In particular, such non-optimum filters can have a transfer response which shows an attenuation response for particular frequencies which is unsatisfactory. By way of example, such a transfer curve can have too little selection with respect to an adjacent channel or with respect to an interfering frequency, for example, the mirror or image frequency. If these conventional measurement corrections are not enough to produce the desired transfer characteristic, then redesign is necessary, i.e., reoptimization with altered constraints, which is complex to implement and also does not necessarily result in an improved transfer characteristic and, in particular, an improved trap characteristic (i.e., filtering a particular frequency).

SUMMARY OF THE INVENTION

It is therefore an object of the present invention to provide a transversal filter with a different trap characteristic which can be used to enhance a software-optimized design in terms of the trap characteristic quickly and efficiently.

The invention achieves this object by providing a SAW transversal filter, comprising a piezoelectrical substrate comprising a respective interdigital transducer in the form of an input transducer and an output transducer; the input transducer having a primary weighting for shaping its transfer function, an aperture of the input transducer being smaller than an aperture of the output transducer, and the output transducer having a secondary weighting, which is substantially lower than the primary weighting, for improving the trap characteristic.

The invention provides that, for such a known transversal filter, besides the primary weighting of the input transducer, the output transducer also be provided with a weighting which is a secondary weighting and has much less weight than the primary weighting on the input transducer. The invention can be used to improve the trap characteristic of a transversal filter in accordance with the invention to a significant extent, which is a surprising result in view of the secondary weighting, whose proportion is small. The measurement correction can be made in a short time, (for example, within one hour) and is therefore much less complex than redesigning the entire transversal filter, which would be necessary without the invention.

The weighting method provided for the secondary weighting is overlap weighting, as for the primary weighting on the input transducer. The extent of the weighting, that is to say the strength of the weighting, is normally given as percentages relative to the aperture of the output transducer and, in accordance with an embodiment of the invention, may be no more than 0.5 to 10% thereof. This maximum weighting defined as a length corresponds to the difference between the shortest and the longest overlap length of two adjacent electrode fingers which are tied to different bus bars and therefore have different polarities.

In line with the invention, a novel method for improving the trap characteristic involves the secondary weighting in the output transducer being effected predominantly outside the acoustic track. According to an embodiment of the invention, at least 95% of the weighting of the output transducer can be outside the acoustic track. In this context, the acoustic track is defined as being the surface area between two straight lines placed parallel to the axis of the wave propagation direction, this surface area being limited on the side of the input transducer by the aperture of the input transducer. Accordingly, the output transducer also has a larger aperture than the input transducer. In this case, the difference between the two apertures should be at least 1% and is normally set to no more than 10%.

A transversal filter in accordance with an embodiment of the invention has an input transducer whose length measured in the axis of the wave propagation is at least three times the length of the output transducer. Hence, the improved trap characteristic is attained despite the relatively low secondary weighting and the relatively short length of the output transducer, which is connected to a correspondingly smaller number of overlaps.

DESCRIPTION OF THE DRAWINGS

The invention is explained in more detail below with reference to an exemplary embodiment and the associated four figures.

FIG. 5 is a schematic diagram of a transversal filter in accordance with an embodiment of the invention.

DETAILED DESCRIPTION OF THE PREFERRED EMBODIMENTS

Figure 1:
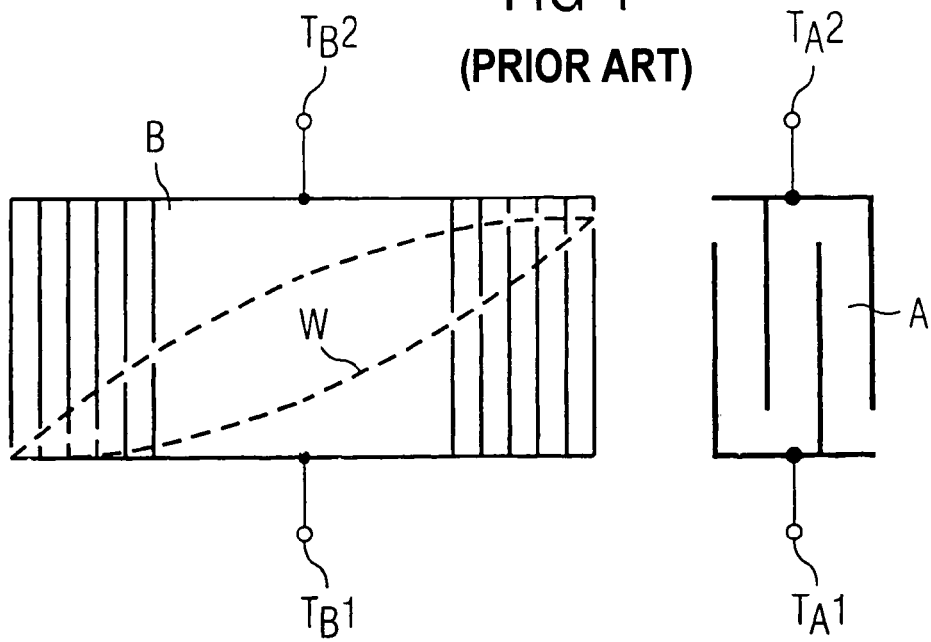
FIG. 1 is a schematic diagram of a known transversal filter.

FIG. 1 shows a schematic illustration (not to scale) of a known transversal filter with an input transducer B and an output transducer A which are arranged on the surface of a piezoelectrical substrate. In the illustration shown, the input transducer B is in the form of an overlap-weighted split finger transducer and the output transducer A is in the form of an unweighted normal finger transducer. W denotes the envelope for the overlap lengths of adjacent electrode fingers coming from different bus bars in order to illustrate the weighting shown by way of example. In addition, the output transducer A has a shorter length than the input transducer B.

During operation of the filter, the input signal is applied to the connections $T_B1$ and $T_B2$, while the output signal can be tapped off on the connections $T_A1$ and $T_A2$.

Figure 2:
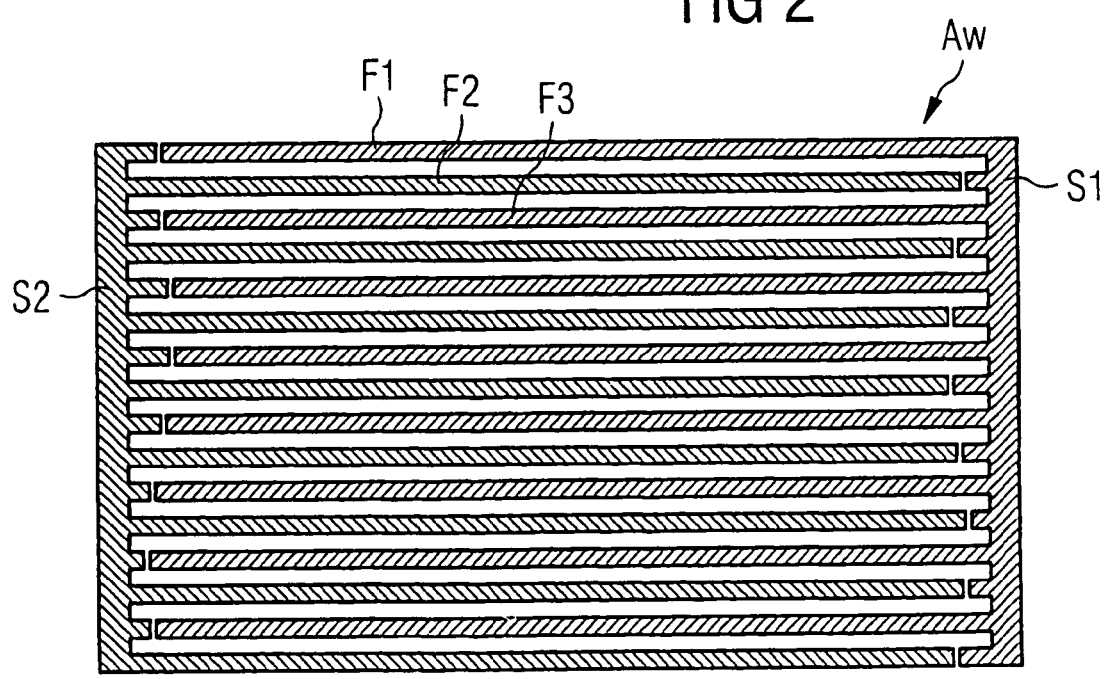
FIG. 2 is a schematic diagram of an output transducer for a transversal filter in accordance with an embodiment of the invention.

FIG. 2 shows a generally pictorially accurate illustration of an inventive output transducer $A_W$ which is furnished with a secondary weighting in accordance with the invention. Such a transducer can be used in one of the transversal filters shown by way of example in FIG. 1 instead of the normal finger transducers A there. FIG. 2 clearly shows that the overlap weightings used in the inventive output transducer $A_W$ have just a small weight, and the difference between the smallest and the largest overlap between adjacent electrode fingers F1, F2, F3, etc. coming from different bus bars S1, S2 is therefore only slight. The maximum weighting is between 0.5 and 10% in relation to the aperture of the output transducer and, in one specific case, is 5.43% of the total aperture of the output transducer $A_W$.

Figure 3:
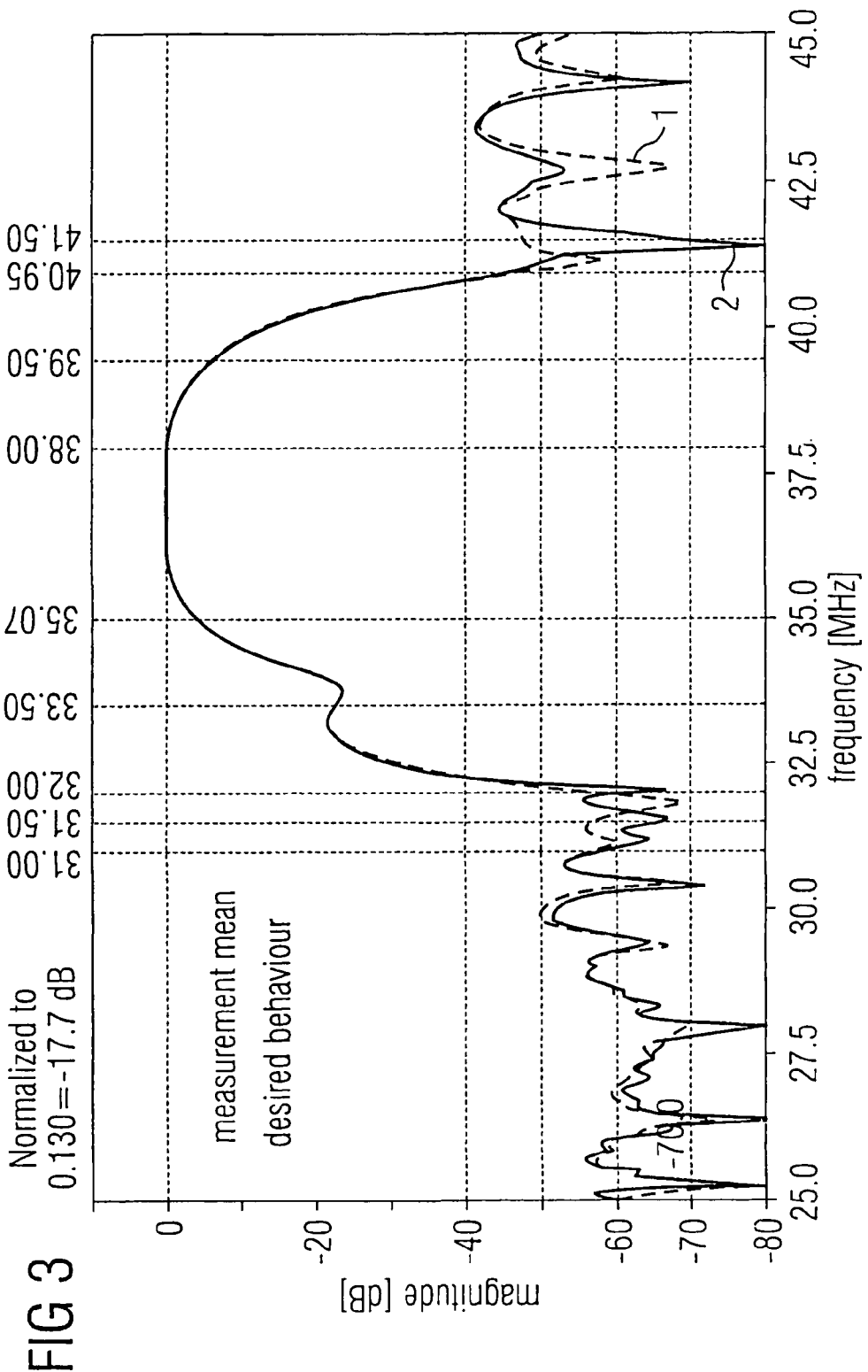
FIG. 3 is a graph showing the transfer response of a known transversal filter in comparison with the calculated transfer response of a transversal filter in accordance with an embodiment of the invention.

FIG. 3 is a graph comparing the measured transfer response of a known transversal filter (measurement curve 1, dashed line) having an unweighted output transducer A with the calculated transfer response of a filter in accordance with the invention (measurement curve 2, solid line). The design optimized using software shows an improved selection in the model calculation for an indicated trap frequency of 41.5 MHz, the effect of such selection being improved attenuation at this frequency.

Figure 4:
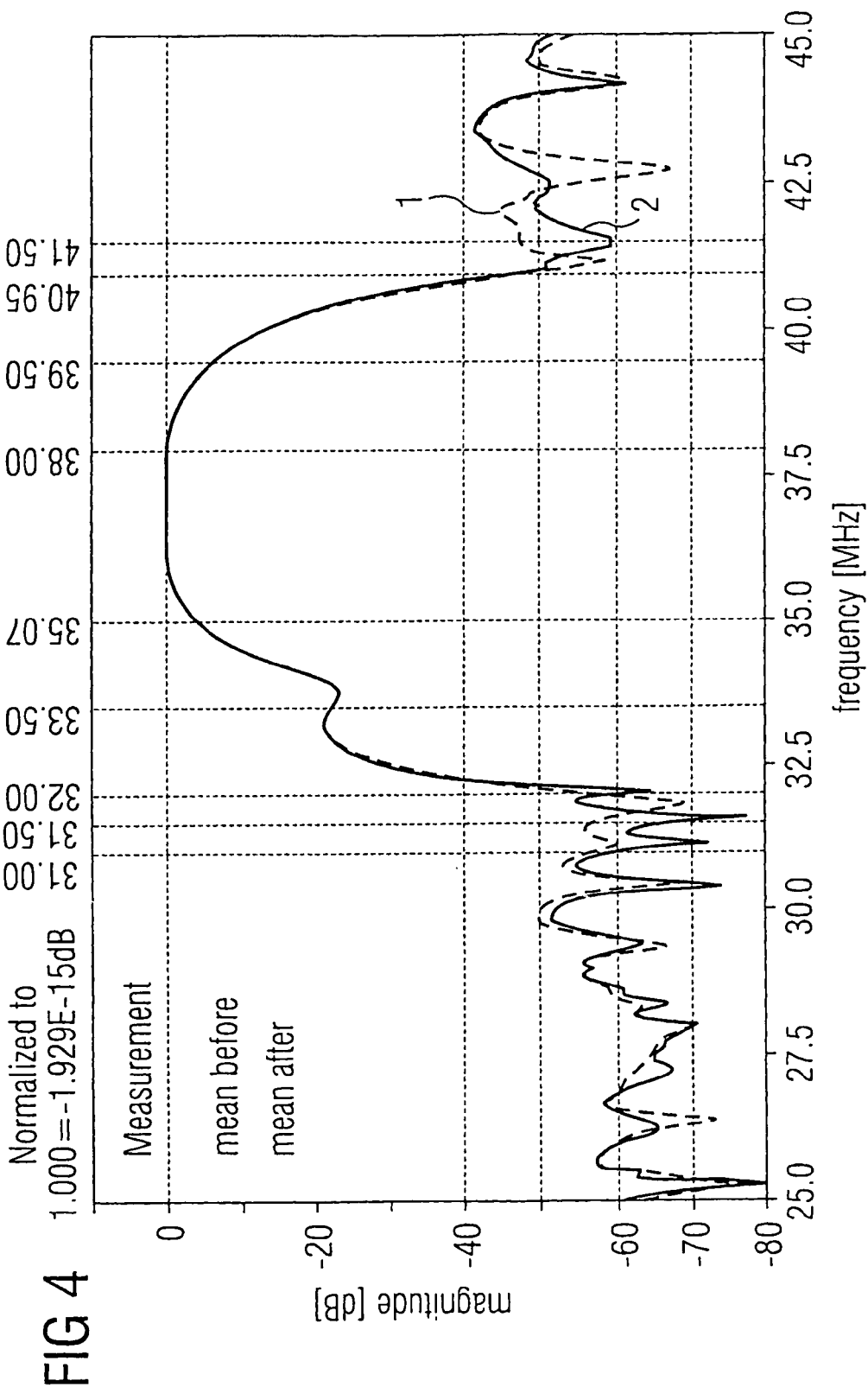
FIG. 4 is a graph showing the transfer response of a known transversal filter in comparison with an embodiment of the inventive transversal filter's transfer response measured in real terms.

FIG. 4 in turn compares the transfer response, measured in real terms, of a known transversal filter with an unweighted output transducer A (measurement curve 1, dashed line) with the transfer response, measured in real terms, of an inventive transversal filter (measurement curve 2, solid line). It can be seen that although the measurement curve 2 for the inventive filter does not quite have the expected outstanding trap characteristic, the inventive filter is nevertheless furnished with a selection improved by approximately 11 dB at the trap frequency of 41.5 MHz. If the transfer response is otherwise unchanged in the passband, which is significant for the transfer properties and the frequency stability of the filter, the inventive filter is improved overall by this improved trap characteristic.

Besides the 41.5 MHz trap chosen by way of example, the invention naturally also allows optimizations for other individual or else for a plurality of traps in parallel.

FIG. 5 schematically shows an input transducer B having a primary weighting WB and an aperature ApB. The transducer can be the same as the prior art input transducer B shown in FIG. 1. Furthermore, and output transducer A is shown having a secondary weighting WA and an aperature ApA (where ApA>ApB). The length of the input transducer B is about three times the length of the output transducer A. The secondary weighting WA shown schematically can be like the one shown at the output transducer in FIG. 2, but is not restricted to the illustrated weighting function.

It can thus be seen that the inventive secondary weighting in the output transducer of a transversal filter in accordance with the invention allows a better overall transfer response to be attained which allows improved selection to be achieved for trap frequencies, particularly by way of specific and rapidly possible optimization.

For the purposes of promoting an understanding of the principles of the invention, reference has been made to the preferred embodiments illustrated in the drawings, and specific language has been used to describe these embodiments. However, no limitation of the scope of the invention is intended by this specific language, and the invention should be construed to encompass all embodiments that would normally occur to one of ordinary skill in the art. The particular implementations shown and described herein are illustrative examples of the invention and are not intended to otherwise limit the scope of the invention in any way. For the sake of brevity, conventional aspects may not be described in detail. Furthermore, the connecting lines, or connectors shown in the various figures presented are intended to represent exemplary functional relationships and/or physical or logical couplings between the various elements. It should be noted that many alternative or additional functional relationships, physical connections or logical connections may be present in a practical device. Moreover, no item or component is essential to the practice of the invention unless the element is specifically described as "essential" or "critical". Numerous modifications and adaptations will be readily apparent to those skilled in this art without departing from the spirit and scope of the present invention.

The invention claimed is:

1. A SAW transversal filter, comprising:
   a piezoelectrical substrate comprising a respective interdigital transducer in the form of an input transducer and an output transducer;
   the input transducer having a primary weighting for shaping its transfer function, an aperture of the input transducer being smaller than an aperture of the output transducer, and the output transducer having a secondary weighting, which is substantially lower than the primary weighting, for improving the trap characteristic;
   wherein a maximum secondary weighting in the output transducer, defined as the difference between a shortest and a longest overlap length of two adjacent electrode fingers having different polarity, is between 0.5% and 10% of the aperture of the output transducer.

2. The transversal filter as claimed in claim 1, wherein the weighting method provided for the primary and the secondary weighting is overlap weighting.

3. The transversal filter as claimed in claim 1, wherein:
   overlap weighting is used for the weighting method provided for the the output transducer; and
   at least 95% of the overlap weightings of the output transducer are outside the filter's track defined by the input transducer's aperture.

4. A SAW transversal filter, comprising:
   a piezoelectrical substrate comprising a respective interdigital transducer in the form of an input transducer and an output transducer;

the input transducer having a primary weighting for shaping its transfer function, an aperture of the input transducer being smaller than an aperture of the output transducer, and the output transducer having a secondary weighting, which is substantially lower than the primary weighting, for improving the trap characteristic;

wherein an input transducer length, measured in an axis of the surface wave's wave propagation, is at least triple an output transducer length.

5. A SAW transversal filter, comprising:

a piezoelectrical substrate comprising a respective interdigital transducer in the form of an input transducer and an output transducer;

the input transducer having a primary weighting for shaping its transfer function, an aperture of the input transducer being smaller than an aperture of the output transducer, and the output transducer having a secondary weighting, which is substantially lower than the primary weighting, for improving the trap characteristic;

wherein the secondary weighting is optimized for maximum attenuation in the filter for a given trap frequency.

6. A method of using a SAW transversal filter, the SAW transversal filter comprising:

a piezoelectrical substrate comprising a respective interdigital transducer in the form of an input transducer and an output transducer;

the input transducer having a primary weighting for shaping its transfer function, an aperture of the input transducer being smaller than an aperture of the output transducer, and the output transducer having a secondary weighting, which is substantially lower than the primary weighting, for improving the trap characteristic;

wherein a maximum secondary weighting in the output transducer, defined as the difference between a shortest and a longest overlap length of two adjacent electrode fingers having different polarity, is between 0.5% and 10% of the aperture of the output transducer;

the method comprising:

utilizing the SAW transversal filter as an intermediate frequency filter in consumer electronics or for precise-frequency applications.

* * * * *